United States Patent
Geho

(10) Patent No.: US 6,712,902 B2
(45) Date of Patent: Mar. 30, 2004

(54) FEED ROD FOR GROWING MAGNETIC SINGLE CRYSTAL, MAGNETIC SINGLE CRYSTAL, AND METHOD OF PRODUCING A MAGNETIC SINGLE CRYSTAL

(75) Inventor: Mikio Geho, Otsu (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 13 days.

(21) Appl. No.: 10/218,457

(22) Filed: Aug. 15, 2002

(65) Prior Publication Data
US 2003/0041797 A1 Mar. 6, 2003

(30) Foreign Application Priority Data
Aug. 20, 2001 (JP) ......... 2001-249403

(51) Int. Cl.⁷ .......... C30B 13/22; C30B 13/40; C30B 13/60
(52) U.S. Cl. .......... 117/49; 117/50; 117/51
(58) Field of Search .......... 117/49, 50, 51

(56) References Cited

U.S. PATENT DOCUMENTS 4,256,531 A * 3/1981 Kimura et al. ............ 117/42
5,063,986 A * 11/1991 Murakami et al. ....... 164/122.2
6,350,703 B1 * 2/2002 Sakaguchi et al. ......... 438/766

FOREIGN PATENT DOCUMENTS

JP 10-251088 9/1998

* cited by examiner

Primary Examiner—Felisa Hiteshew
(74) Attorney, Agent, or Firm—Dickstein, Shapiro, Morin & Oshinsky, LLP.

(57) ABSTRACT

A feed rod for growing a magnetic single crystal having a composition represented by the formula $(Y_{3-a}A_a)(Fe_{5-b-c}B_b)O_{12-\alpha}$, wherein A is at least one element selected from the lanthanoide series, B is at least one element selected from the group consisting of Ga, Al, In, and Sc, c is a value for decreasing the Fe content from the stoichiometric amount, $\alpha$ is a value for decreasing the oxygen content to satisfy the chemically neutral condition, and the relationships $0 \leq a \geq 0.5$; $0 \leq b \geq 1.0$; $0 < c \geq 0.15$ and $0 < \alpha$ are satisfied.

4 Claims, 1 Drawing Sheet

FEED ROD FOR GROWING MAGNETIC SINGLE CRYSTAL, MAGNETIC SINGLE CRYSTAL, AND METHOD OF PRODUCING A MAGNETIC SINGLE CRYSTAL

BACKGROUND OF THE INVENTION

1. Field of the Invention

The present invention relates to a feed rod for growing a magnetic single crystal and to a magnetic single crystal.

2. Description of the Related Art

With respect to high-frequency devices, such as isolators, circulators, and magnetostatic wave devices, since there are demands for miniaturization and higher performance, the need for magnetic single crystals is increasing. Magnetic single crystals are also used for magneto-optical devices, such as optical isolators, magneto-optical sensors, and optical modulators using optical high frequency coupling.

In order to produce bulk single crystals, various methods have been proposed and put into practical use, and examples thereof are the Czochralski method (hereinafter referred to as the "CZ method") and the floating-zone method (hereinafter referred to as the "FZ method").

A light-focusing and heating method in which heating is performed by focused light is a representative of the FZ method. In the light-focusing and heating method, a raw material polycrystal (feed rod) is held in a furnace, and a predetermined zone thereof is melted by heating at a temperature that is higher than the melting point to form a molten zone. By moving the molten zone, the molten zone is cooled and solidified, thus growing a single crystal. This method is advantageous in that high purity of the crystal is maintained because the crystal is not brought into contact with a crucible and that the growth rate of the crystal is high because of a steep temperature gradient. As the FZ method in which the crystal is not brought into contact with a crucible, for example, a laser-heating pedestal growth method (hereinafter referred to as a "LHPG method") using a combination of heating by focused light and laser heating is disclosed in Japanese Unexamined Patent Application Publication No. 6-48883.

Examples of materials used for high-frequency devices, such as isolators, include an yttrium-iron-garnet ($Y_3Fe_5O_{12}$; hereinafter referred to as YIG) single crystal. The YIG is an incongruent melting compound, and it is not possible to directly produce a single crystal having the same composition simply by cooling and solidifying a melt having a stoichiometric composition. That is, when the YIG melt having the stoichiometric composition is solidified, an orthoferrite ($YFeO_3$) precipitates as the initial phase, and at approximately 1,585° C., the orthoferrite reacts with the liquid phase to form YIG. Therefore, in the conventional FZ method, since the orthoferrite deposits on the joint between the feed rod and the seed crystal, it is not possible to control the growth orientation of the single crystal.

As a method capable of controlling the growth orientation of the single crystal, a traveling solvent floating zone method (hereinafter referred to as a "TSFZ method"), which is another variation of the floating zone method, is known. In this method, a solvent whose composition and weight are precisely controlled is placed on a seed crystal, and after the solvent and the seed crystal are fully fused with each other by heating, a raw material polycrystal (feed rod) is joined thereto to grow a single crystal. In this method, it is possible to grow a bulk single crystal of an incongruent melting compound from the melt while controlling the growth orientation. Therefore, recently, the TSFZ method has been widely used to produce YIG single crystals.

However, when an attempt is made to produce a single crystal in the shape of a fiber having a diameter of 2 mm or less by the TSFZ method, it is physically difficult to place a solvent on the seed crystal, and moreover, since the amount of solvent is very small, it is difficult to control the weight thereof. For the reasons described above, if the amount of the solvent becomes unsuitable, the growing conditions for the single crystal become unstable, and the growing single crystal is broken due to the remaining orthoferrite layer or the excessive amount of solvent.

In order to produce a fiber-like single crystal, a self-solvent floating zone method (hereinafter referred to as a "SSFZ method") is disclosed in Japanese Unexamined Patent Application Publication No. 10-251088, which overcomes the problems described above. In this method, an end of a raw material polycrystal (feed rod), i.e., the end opposite to the end to be joined to the seed crystal, is heated and melted to cause an incongruent melting reaction, and the generated liquid phase is moved to the seed crystal side to be joined to the seed crystal. In the SSFZ method, a fiber-like single crystal is grown while controlling the growth orientation by placing the orthoferrite ($YFeO_3$) outside the reaction system.

However, when a YIG single crystal is produced by the SSFZ method, if the growth rate is increased in order to improve the productivity, the orientation controllability of the growing single crystal is lost, the ferromagnetic resonance half-value width ($\Delta H$) is significantly increased, and the magnetic properties are remarkably degraded. Therefore, the YIG single crystal must be grown at a rate of 10 mm/hour or less, resulting in low productivity and high cost.

SUMMARY OF THE INVENTION

In order to overcome the problems described above, preferred embodiments of the present invention provide a feed rod for growing a magnetic single crystal capable of producing a YIG single crystal in which the orientation controllability of the single crystal is maintained, the ferromagnetic resonance half-value width ($\Delta H$) is not increased, and the magnetic properties are not degraded even if the growth rate is increased, and to provide a magnetic single crystal.

A preferred embodiment of the present invention comprises a feed rod for growing a magnetic single crystal having a composition represented by the formula $(Y_{3-a}A_a)(Fe_{5-b-c}B_b)O_{12-\alpha}$, wherein A is at least one element selected from the lanthanoide series, B is at least one element selected from the group consisting of Ga, Al, In, and Sc, c is a value for decreasing the Fe content from the stoichiometric amount, $\alpha$ is a value for decreasing the oxygen content to satisfy the chemically neutral condition, and the relationships $0 \leq a \geq 0.5$; $0 \leq b \geq 1.0$; $0 < c \geq 0.15$ and $0 < \alpha$ are satisfied.

Another preferred embodiment of the present invention comprises a magnetic single crystal having a composition represented by the formula $(Y_{3-a}A_a)(Fe_{5-b-c}B_b)O_{12-\alpha}$, wherein A is at least one element selected from the lanthanoide series, B is at least one element selected from the group consisting of Ga, Al, In, and Sc, c is a value for decreasing the Fe content from the stoichiometric amount, $\alpha$ is a value for decreasing the oxygen content to satisfy the chemically neutral condition, and the relationships $0 \leq a \geq 0.5$; $0 \leq b \geq 1.0$; $0 < c \geq 0.15$ and $0 < \alpha$ are satisfied.

By decreasing the Fe content in the feed rod for growing the YIG single crystal from the stoichiometric amount by the value c and by decreasing the oxygen content by the value $\alpha$ to satisfy the chemically neutral condition, even if the growth rate of the YIG single crystal is increased, it is possible to obtain a YIG single crystal in which the orientation controllability is maintained and which has satisfactory magnetic properties with a small ferromagnetic resonance half-value width ($\Delta H$). Consequently, the productivity is improved and it is possible to supply stable and inexpensive magnetic single crystals.

DETAILED DESCRIPTION OF PREFERRED EMBODIMENTS

Figure 1A:
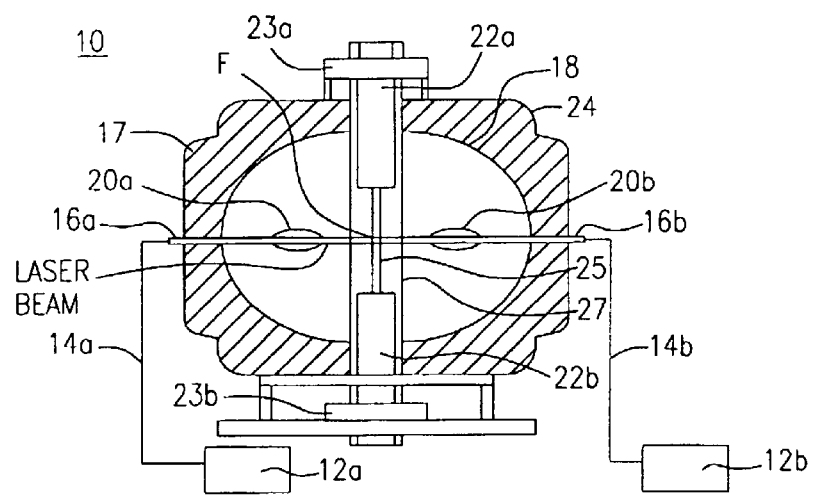
FIG. 1A is a frontal sectional view of a single crystal growing apparatus using laser heating.
Figure 1B:
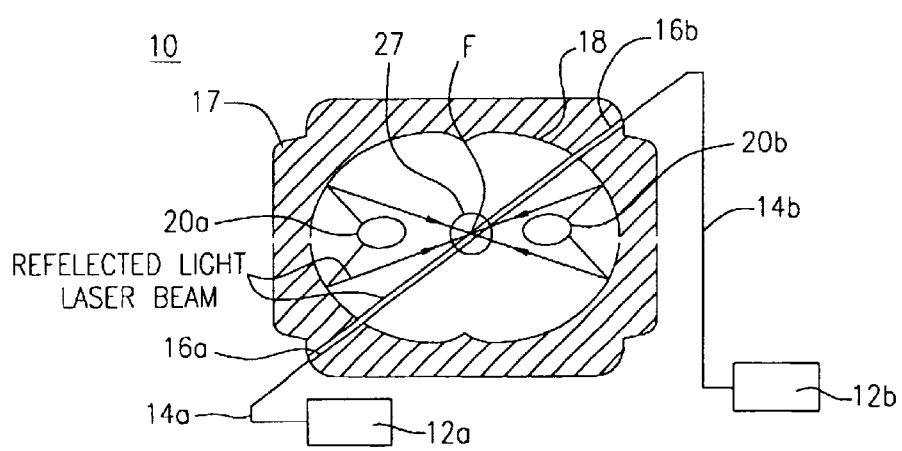
FIG. 1B is a plan sectional view of the single crystal growing apparatus shown in FIG. 1A.

FIG. 1A is a frontal sectional view of a single crystal growing apparatus using laser heating by which a single crystal is grown using a feed rod for growing a magnetic single crystal in accordance with the present invention, and FIG. 1B is a plan sectional view of the apparatus. A single crystal growing apparatus 10 includes laser oscillators 12a and 12b constituting a primary heating device. Laser beams emitted from the laser oscillators 12a and 12b are guided to laser inlets 16a and 16b through optical fibers 14a and 14b, respectively. The single crystal growing apparatus 10 includes a housing 17, and a reflecting mirror 18 formed in the housing 17. The laser inlets 16a and 16b are disposed so as to penetrate the housing 17 and the reflecting mirror 18 and to face each other with the central section of a space surrounded by the reflecting mirror 18 therebetween. Heating light sources 20a and 20b, such as halogen lamps, are disposed inside the reflecting mirror 18, thus constituting an auxiliary heating device.

Light from the heating light sources 20a and 20b is reflected from the inner surface of the reflecting mirror 18 and is focused to a light-focusing and heating focal point F. Laser beams from the laser inlets 16a and 16b are also emitted toward the light-focusing and heating focal point F. By placing a sample at the light-focusing and heating focal point F, although the sample is heated to a high temperature, the periphery thereof is not heated. Therefore, the temperature steeply decreases with the distance from the light-focusing and heating focal point F. By adjusting the outputs of the heating light sources 20a and 20b, the temperature gradient in the vicinity of the molten zone in a feed rod 24 for growing a single crystal and a seed crystal 25 can be controlled.

Inside surrounded by the reflecting mirror 18, an upper shaft 22a and a lower shaft 22b for holding the feed rod 24 for growing the single crystal and the seed crystal 25 are disposed so as to face each other with the light-focusing and heating focal point F therebetween. The upper shaft 22a and the lower shaft 22b are mounted on an upper shaft moving device 23a and a lower shaft moving device 23b, respectively. The upper shaft moving device 23a and the lower shaft moving device 23b move the upper shaft 22a and the lower shaft 22b, respectively.

The feed rod 24 for growing the single crystal is fixed on the lower end of the upper shaft 22a, and the seed crystal 25 is fixed on the upper end of the lower shaft 22b. In this way, the feed rod 24 and the seed crystal 25 are held so as to butt against each other. Additionally, the upper shaft 22a, the lower shaft 22b, the feed rod 24 for growing the single crystal, the seed crystal 25, and the growing single crystal are placed in a quartz tube 27.

EXAMPLES

YIG single crystals were produced by the SSFZ method using the single crystal growing apparatus 10 shown in FIGS. 1A and 1B.

As the feed rod 24 for growing the single crystal, samples having compositions represented by the formula $(Y_{3-a}A_a)(Fe_{5-b-c}B_b)O_{12-\alpha}$ were used, in which Ce was selected as the substituent element A, and Al was selected as the substituent element B. As shown in Table 1 below, the value b for Al was set at 0.5, the value c was set at 0.025, and the value a for Ce was varied in the range of 0 to 0.8. In Table 1, the asterisked sample was out of the range of the present invention.

TABLE 1

| Sample No. | Ce (a) | Al (b) | (c) | Growth rate (mm/hr) | Orientation Controllability | Single Crystallinity | Faraday Rotation Angle (deg · cm$^{-1}$) |
|---|---|---|---|---|---|---|---|
| 1 | 0 | 0.5 | 0.025 | 30 | Satisfactory | Satisfactory | +140 |
| 2 | 0.3 | 0.5 | 0.025 | 30 | Satisfactory | Satisfactory | −900 |
| 3 | 0.5 | 0.5 | 0.025 | 30 | Satisfactory | Satisfactory | −1,400 |
| *4 | 0.8 | 0.5 | 0.025 | 30 | Unsatisfactory | Unsatisfactory | Unmeasurable |

As the seed crystal 25, a <110> oriented YIG single crystal was used. The seed crystal 25 was fixed on the upper end of the lower shaft 22b, and the feed rod 24 for growing the single crystal was fixed on the lower end of the upper shaft 22a. The end of the feed rod 24 facing the seed crystal 25 was disposed at the light-focusing and heating focal point F and melted by heating with the main heating device and the auxiliary heating device, and the end of the seed crystal 25 was butt joined thereto.

Next, heating was stopped, and by moving the upper shaft 22a and the lower shaft 22b synchronously, the opposite end of the feed rod 24 was placed at the light-focusing and heating focal point F. The opposite end was melted by heating to form a molten zone (not shown in the drawing). The molten zone was then moved to the joint between the feed rod 24 and the seed crystal 25 by moving the upper shaft 22a and the lower shaft 22b synchronously. The molten zone was brought into contact with the seed crystal 25 to perform seeding. At this stage, in order to perform satisfactory seeding, the molten zone was held at the joint between the feed rod 24 and the seed crystal 25 for a predetermined period of time.

Next, by moving the molten zone from the joint of the feed rod 24 to the other end, melting by heating and solidification by cooling were continuously performed at the growth rate (moving rate of the molten zone) shown in Table 1 while controlling the orientation, and a YIG single crystal in the shape of a fiber having a diameter of 1.0 mm was produced.

With respect to the YIG single crystal samples thus obtained, orientation controllability was investigated by measuring the X-ray pole figure to confirm whether or not single crystals were produced. The Faraday rotation angle was also measured at a wavelength of 1.55 μm.

The measurement results are shown in Table 1. In Table 1, "Satisfactory" in the orientation controllability column means that the axial direction of the grown crystal was substantially the same as that of the seed crystal within the error range. "Satisfactory" in the single crystallinity column means that single-phase YIG having the same composition as that of the feed rod for growing the single crystal was obtained.

As a result, as shown in Sample No. 4, when the value a of the substituent element Ce exceeded 0.5, which was above the solubility limit of Ce, the excess was not substituted in YIG, and the resultant crystal contained precipitates (inclusions). However, with respect to Sample Nos. 1 to 3 in which the value a was 0.5 or less, even at a fast growth rate of 30 mm/hour, single crystals having the same composition as that of the feed rod for growing the single crystal were obtained, in which the orientation was adjusted to the <110> orientation, the same as the seed crystal. With respect to Sample No. 2 in which the value a was 0.3, the Faraday rotation angle was −900 deg.cm$^{-1}$, and with respect to Sample No. 3 in which the value a was 0.5, the Faraday rotation angle was −1,400 deg.cm$^{-1}$. Thus, it was confirmed that Ce was substituted for Y. Therefore, preferably, the value a satisfies the relationship $0 \leq a \geq 0.5$.

Next, as the feed rod 24 for growing the single crystal, samples having compositions represented by the formula $(Y_{3-a}A_a)(Fe_{5-b-c}B_b)O_{12-\alpha}$ were used, in which La was selected as the substituent element A, and Ga was selected as the substituent element B. As shown in Table 2, the value a for La was set at 0.1, the value c was set at 0.025, and the value b for Ga was varied in the range of 0 to 1.5. In Table 2, the asterisked sample was out of the range of the present invention.

TABLE 2

| Sample No. | La (a) | Ga (b) | (c) | Growth rate (mm/hr) | Orientation Controllability | Single Crystallinity | Ms (mT) |
|---|---|---|---|---|---|---|---|
| 5 | 0.1 | 0 | 0.025 | 30 | Satisfactory | Satisfactory | 176 |
| 6 | 0.1 | 0.95 | 0.025 | 30 | Satisfactory | Satisfactory | 35 |
| 7 | 0.1 | 1.0 | 0.025 | 30 | Satisfactory | Satisfactory | 5 |
| *8 | 0.1 | 1.5 | 0.025 | 30 | Unsatisfactory | Unsatisfactory | — |

As the seed crystal 25, a <100> oriented YIG single crystal was used, and YIG single crystals in the shape of a fiber having a diameter of 0.5 mm were produced at the growth rate shown in Table 2 in the same manner as that described above while controlling the orientation.

With respect to the YIG single crystal samples thus obtained, orientation controllability and single crystallinity were investigated in the same manner as that described above, and saturation magnetization (Ms) was also measured by the VSM method.

The measurement results are shown in Table 2. In Table 2, "Satisfactory" in the orientation controllability column and "Satisfactory" in the single crystallinity column have the same meanings as those in Table 1.

As a result, as shown in Sample No. 8, when the value b of the substituent element Ga exceeded 1.0, which was above the solubility limit of Ga, the excess was not substituted in YIG, and the resultant crystal contained precipitates (inclusions). However, with respect to Sample Nos. 5 to 7 in which the value b was 1.0 or less, even at a fast growth rate of 30 mm/hour, single crystals having the same composition as that of the feed rod for growing the single crystal were obtained, in which the orientation was adjusted to the <100> orientation, the same as the seed crystal. Saturation magnetization (Ms) decreased as the value b for Ga increased, and thus it was confirmed that Ga was substituted for Fe. Therefore, preferably, the value b satisfies the relationship $0 \leq b \geq 1.0$.

Next, as the feed rod 24 for growing the single crystal, samples having compositions represented by the formula $(Y_{3-a}A_a)(Fe_{5-b-c}B_b)O_{12-\alpha}$ were used, in which the substituent element A was not used, and Ga was selected as the substituent element B. As shown in Table 3, the value b for Ga was set at 0 or 0.4, and the value c was varied in the range of 0 to 0.25. In Table 3, the asterisked samples were out of the range of the present invention.

TABLE 3

| Sample No. | (a) | Ga (b) | (c) | Growth rate (mm/hr) | Orientation Controllability | Single Crystallinity | ΔH (A/m) |
|---|---|---|---|---|---|---|---|
| *9 | 0 | 0 | 0 | 20 | Unsatisfactory | Satisfactory | Unmeasurable |
| 10 | 0 | 0 | 0.01 | 20 | Satisfactory | Satisfactory | 310 |
| 11 | 0 | 0 | 0.01 | 30 | Satisfactory | Satisfactory | 500 |
| *12 | 0 | 0.4 | 0 | 30 | Unsatisfactory | Unsatisfactory | 1,500 |
| 13 | 0 | 0.4 | 0.05 | 30 | Satisfactory | Satisfactory | 700 |
| 14 | 0 | 0.4 | 0.10 | 30 | Satisfactory | Satisfactory | 550 |
| 15 | 0 | 0.4 | 0.15 | 30 | Satisfactory | Satisfactory | 900 |
| *16 | 0 | 0.4 | 0.25 | 30 | Unsatisfactory | Unsatisfactory | 2,600 |

As the seed crystal 25, a <111> oriented YIG single crystal was used, and YIG single crystals in the shape of a fiber having a diameter of 0.5 mm were produced at the growth rate shown in Table 3 in the same manner as that described above while controlling the orientation.

With respect to the YIG single crystal samples thus obtained, orientation controllability and single crystallinity were investigated in the same manner as that described above, and the ferromagnetic resonance half-value width (ΔH) was measured by FMR measurement using an ESR apparatus. In order to measure ΔH, the sample was cut into a piece with a diameter of 0.5 mm and a length of 1 mm, a DC magnetic field was applied in the axial direction of the grown crystal, and electromagnetic waves were applied perpendicular to the DC magnetic field.

The measurement results are shown in Table 3. In Table 3, "Satisfactory" in the orientation controllability column and "Satisfactory" in the single crystallinity column have the same meanings as those in Table 1. "Unmeasurable" in the ΔH column means that no FMR peak arose.

As a result, as shown in Sample Nos. 9 and 12, when the value c was 0, satisfactory orientation controllability and single crystallinity were not obtained. As shown in Sample No. 16, when the value c exceeded 0.15, a deviation in the composition occurred and it was not possible to obtain a single-phase single crystal. However, with respect to Sample Nos. 10 and 11 and Sample Nos. 13 to 15 in which the relationship $0<c\leqq0.15$ was satisfied, orientation controllability and single crystallinity were maintained even at a fast growth rate of 20 to 30 mm/hour. Additionally, a smaller ferromagnetic resonance half-value width (ΔH) is preferred for the device because of the smaller loss. In accordance with the present invention, single crystals with a ferromagnetic resonance half-value width (ΔH) of 1,000 A/m or less is obtained, and thus single crystals with excellent magnetic properties can be obtained. Therefore, preferably, the value c satisfies the relationship $0<c\leqq0.15$.

The presence of c in the composition represented by the formula $(Y_{3-a}A_a)(Fe_{5-b-c}B_b)O_{12-\alpha}$ is the major feature of the present invention. The Fe content is decreased from the stoichiometric amount by the value c, and the oxygen content is decreased by the value a in order to achieve the chemically neutral condition. For example, when Fe is trivalent and the value c is 0.15, with respect to divalent oxygen, the value α is calculated to be 0.225. When Fe is divalent instead of trivalent, the value α changes. By using such a feed rod for growing a single crystal, even if the growth rate of the single crystal is increased beyond a conventional growth rate of 10 mm/hour, it is possible to produce a single crystal which has the same orientation as that of the seed crystal and which has the same composition as that of the feed rod.

Additionally, the feed rod for growing the single crystal used in the examples is a preliminarily sintered polycrystalline ceramic rod. The sintered density thereof is preferably as high as possible, and the sintered relative density is preferably 90% or more. The molten zone is a portion of the partially melted feed rod which is held between the unmelted ends of the rod by surface tension. The molten zone may be moved either by moving the heat source or by moving the feed rod including the molten zone.

In the examples described above, Ce and La were used as the substituent element A, and Al and Ga were used as the substituent element B. However, the present invention is not limited thereto. The same effects as those of the examples may be exhibited by using at least one element selected from the lanthanoide series other than Ce and La (i.e., Pr, Nd, Pm, Sm, Eu, Gd, Tb, Dy, Ho, Er, Tm, Yb, Lu, Sc and Y) as the substituent element A, and by using at least one element selected from the group consisting of In and Sc instead of Al and Ga as the substituent element B.

In the examples described above, the SSFZ method was used in order to grow fiber-like YIG single crystals with a diameter of 0.5 mm or 1.0 mm. If single crystals are not limited to be in the shape of a fiber with a small diameter, even if other types of the FZ method instead of the SSFZ method are used, the same YIG single crystals as those obtained in the examples may be produced. The feed rod may be any shape, such as round, square, or plate-like, depending on the cross-sectional shape of a single crystal to be grown.

With respect to primary energy required for melting the feed rod, preferably, laser beams which can easily perform partial heating in a non-contact manner are used. That is, a $CO_2$ gas laser, a YAG laser, a semiconductor laser, or the like may be used.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A feed rod for growing a magnetic single crystal, the feed rod having a composition represented by the formula:

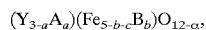

$(Y_{3-a}A_a)(Fe_{5-b-c}B_b)O_{12-\alpha}$, wherein A is at least one element selected from the lanthanoide series; B is at least one element selected from the group consisting of Ga, Al, In, and Sc; c is a value which decreases the Fe content from a stoichiometric amount; α is a value which decreases the oxygen content to satisfy a chemically neutral condition; and the relationships $0 \leq a \geq 0.5$, $0 \leq b \geq 1.0$, $0 < c \geq 0.15$, and $0 < \alpha$ are satisfied.

2. A magnetic single crystal having a composition represented by the formula:

$$(Y_{3-a}A_a)(Fe_{5-b-c}B_b)O_{12-\alpha},$$

wherein A is at least one element selected from the lanthanoide series; B is at least one element selected from the group consisting of Ga, Al, In, and Sc; c is a value which decreases the Fe content from a stoichiometric amount; $\alpha$ is a value which decreases the oxygen content to satisfy a chemically neutral condition; and the relationships $0 \leq a \geq 0.5$, $0 \leq b \geq 1.0$, $0 < c \geq 0.15$, and $0 < \alpha$ are satisfied.

3. A method for producing a magnetic single crystal, the method comprising:

providing a feed rod for growing the magnetic single crystal, the feed rod having a composition represented by the formula:

$$(Y_{3-a}A_a)(Fe_{5-b-c}B_b)O_{12-\alpha},$$

wherein A is at least one element selected from the lanthanoide series; B is at least one element selected from the group consisting of Ga, Al, In, and Sc; c is a value which decreases the Fe content from a stoichiometric amount; $\alpha$ is a value which decreases the oxygen content to satisfy a chemically neutral condition; and the relationships $0 \leq a \geq 0.5$, $0 \leq b \geq 1.0$, $0 < c \geq 0.15$, and $0 < \alpha$ are satisfied;

providing a seed crystal for crystallization; and crystallizing the feed rod to form the magnetic single crystal.

4. The method for producing a magnetic single crystal according to claim 3, wherein the produced magnetic single crystal has a composition represented by the formula $(Y_{3-a}A_a)(Fe_{5-b-c}B_b)O_{12-\alpha}$.

* * * * *